United States Patent
Ghosh et al.

(10) Patent No.: US 9,905,316 B2
(45) Date of Patent: Feb. 27, 2018

(54) EFFICIENT SENSE AMPLIFIER SHIFTING FOR MEMORY REDUNDANCY

(71) Applicant: QUALCOMM Incorporated, San Diego, CA (US)

(72) Inventors: Sonia Ghosh, San Diego, CA (US); Changho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/225,744

(22) Filed: Aug. 1, 2016

(65) Prior Publication Data

US 2018/0033495 A1 Feb. 1, 2018

(51) Int. Cl.
| G11C 7/00 | (2006.01) |
|---|---|
| G11C 29/00 | (2006.01) |
| G11C 7/06 | (2006.01) |
| G11C 7/22 | (2006.01) |

(52) U.S. Cl.
CPC ............ *G11C 29/781* (2013.01); *G11C 7/065* (2013.01); *G11C 7/22* (2013.01)

(58) Field of Classification Search
CPC ...................................................... G11C 7/065
USPC .................................. 365/189.02, 200, 205
See application file for complete search history.

(56) References Cited

U.S. PATENT DOCUMENTS

| 6,507,524 | B1 | 1/2003 | Agrawal et al. |
|---|---|---|---|
| 6,532,181 | B2 | 3/2003 | Saito et al. |
| 7,216,277 | B1 | 5/2007 | Ngai et al. |
| 7,251,173 | B2 | 7/2007 | Lunde et al. |
| 8,531,899 | B2 | 9/2013 | Zhang et al. |
| 8,717,838 | B1 | 5/2014 | Mishi et al. |
| 2004/0196721 | A1 | 10/2004 | Terzioglu |
| 2012/0314520 | A1 | 12/2012 | Vogelsang et al. |
| 2013/0019133 | A1* | 1/2013 | Zhang .................... G11C 5/147 714/721 |
| 2013/0117615 | A1 | 5/2013 | Kim et al. |
| 2014/0269104 | A1* | 9/2014 | Jung .................. G11C 16/0483 365/189.02 |

OTHER PUBLICATIONS

International Search Report and Written Opinion—PCT/US2017/040746—ISA/EPO—dated Sep. 21, 2017.

* cited by examiner

*Primary Examiner* — Hoai V Ho
(74) *Attorney, Agent, or Firm* — Haynes and Boone, LLP (57) ABSTRACT

A memory includes a plurality of columns and a redundant column. The memory includes a plurality of multiplexers corresponding to the plurality of columns. Depending upon the location of a defect, the multiplexers are configured to select for their corresponding column or an immediately-subsequent column to their corresponding column.

17 Claims, 5 Drawing Sheets

EFFICIENT SENSE AMPLIFIER SHIFTING FOR MEMORY REDUNDANCY

TECHNICAL FIELD

This application relates to memories with column redundancy, and more particularly, to a memory with sense amplifier shifting column redundancy having increased density and power efficiency.

BACKGROUND

Column redundancy allows a memory array to replace a bad column with a redundant column. This redundancy can be performed using the granularity of sense amplifier (SA) shifting or I/O shifting. In both types of memory redundancy, the memory array includes both even and odd columns. To read an even word from the memory, the sense amplifiers in the even columns are enabled. Similarly, just the sense amplifiers in the odd columns are enabled to read an odd word from the memory. With regard to these column types, sense amplifier shifting is denser since just a sense amplifier bitslice is used to replace a defective column, regardless of whether the defective column is even or odd. In contrast, memory redundancy through I/O shifting requires a redundant even column and a redundant odd column. I/O shifting is thus less dense since it requires more redundant columns than sense amplifier shifting memory redundancy schemes.

Figure 1:
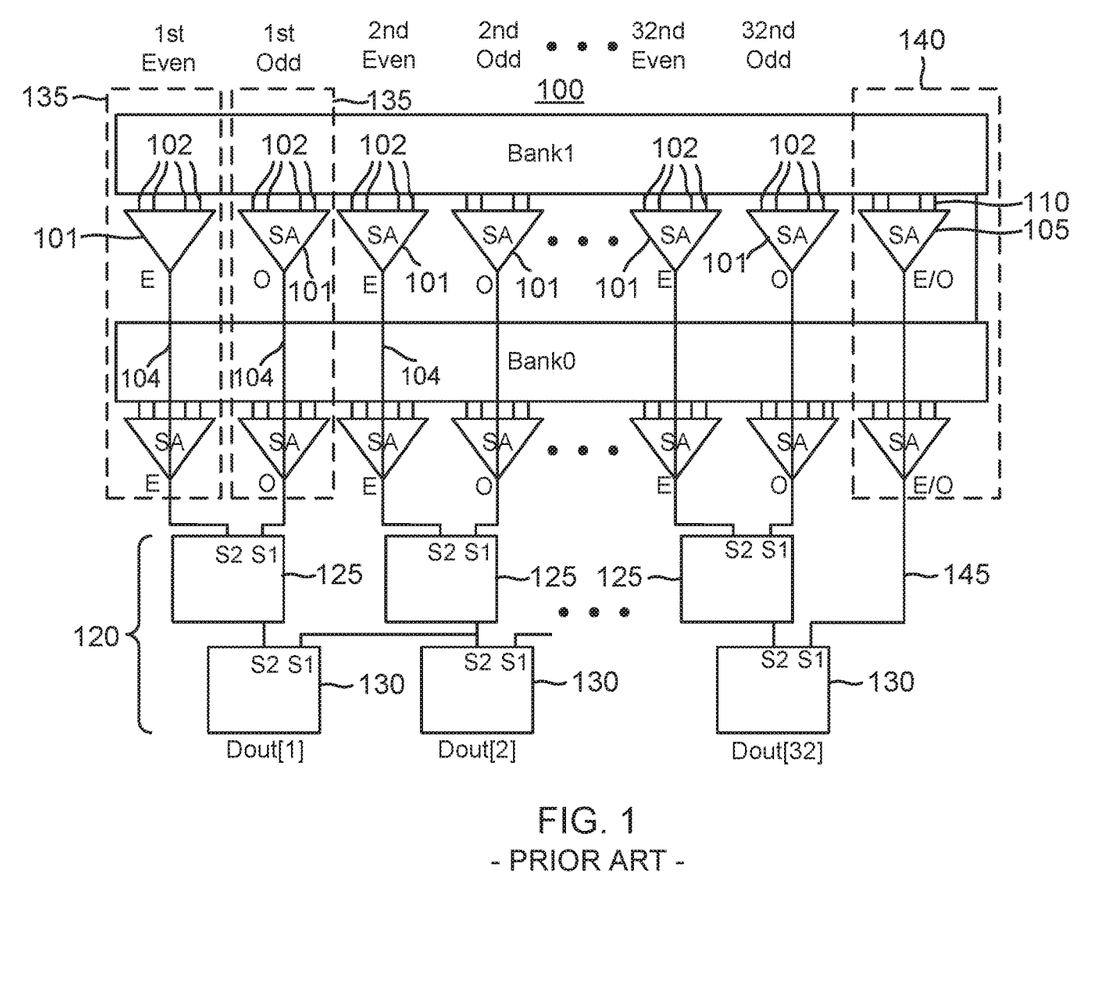
FIG. 1 is a block diagram of a conventional memory configured to use a sense-amplifier shifting redundancy scheme.

Although sense amplifier shifting is advantageously denser, the implementation of a generic redundant column that can be instantiated as either a replacement for a defective even column or for a defective odd column has required complicated control logic. For example, a memory 100 with sense-amplifier shifting is shown in FIG. 1. Two independent memory arrays or banks are included in memory 100: a bank 1 array and a bank 0 array. Each memory bank has its own set of sense amplifiers 101 for sensing the memory bank's bit lines. In particular, each sense amplifier 101 senses from four corresponding bit lines 102 for its corresponding memory bank. There is thus a 4:1 bit-line multiplexing with regard to each sense amplifier 101 for a given memory bank. After sensing a memory cell within the corresponding memory bank through the 4:1 bit line multiplexing, each sense amplifier 101 drives the corresponding binary bit decision onto a read line 104. The read lines 104 are shared by memory bank 0 and by memory bank 1. The bit lines 102, memory cells in bank 0 and bank 1 as well as the corresponding sense amplifiers 101 and read line 104 are denoted herein as a "column." In other words, a column 135 refers to the structure in any given memory bank to drive a sense amplifier's read line 104. That structure would of course include sense amplifier 101 and the associated bit lines 102 and memory cells coupled to those bit lines 102.

For illustration clarity, only a single initial column 135 and a subsequent column 135 are demarcated by dotted lines in memory 100. Each column 135 includes four corresponding bit lines 102 in memory bank 0 and memory bank 1. As known in the memory arts, each sense amplifier 101 is configured to respond to a sense enable signal (not illustrated). If the sense enable signal to a given sense amplifier 101 is asserted, that sense amplifier 101 will drive out a bit decision onto its read line 104.

Memory 100 responds to a read operation by outputting a retrieved word Dout from an output stage 120. Dout is a 32-bit wide retrieved word ranging from a first word bit Dout[1] to a last word bit Dout[32]. Each word Dout can either be an odd (O) word or an even (E) word depending upon whether it was sensed from odd or even columns. In other words, columns 135 are divided into even (E) and odd (O) columns. An even column includes an even sense amplifier for each memory bank. Similarly, an odd column includes an odd sense amplifier for each memory bank. A first even column and a first odd column correspond to Dout[1], depending upon whether the word is odd or even. Similarly, a second even column and a second odd column correspond to Dout[2], and so on such that a $32^{nd}$ even column and a $32^{nd}$ odd column correspond to Dout[32]. Given this odd or even value for each word bit, a first stage of 2:1 multiplexers 125 in output stage 120 enables an 8:1 bit line multiplexing with regard to each word bit.

Just like the odd and even column pairs, each multiplexer 125 corresponds to a bit position in the word Dout. For example, a first multiplexer 125 corresponds to Dout[1], a second multiplexer 125 corresponds to Dout[2], and so on. Each multiplexer 125 can select between the even and odd columns for its corresponding word bit with regard to its S1 and S2 inputs. For example, an initial multiplexer 125 receives the read line 104 for the first even column 135 at an S2 input and receives the read line 104 for the first odd column at an S1 input. Each multiplexer 125 may thus be considered to receive an odd input and an even input.

The sense enable signal to sense amplifiers 101 differentiate between even and odd columns and also between banks. The sense enable signal for a given memory bank may thus have a even state that triggers the sensing of the even bits from the even sense amplifiers and have an odd state that triggers the sensing of the odd bits from the odd sense amplifiers. In a default state (no column errors), multiplexers 125 are then controlled to select for their odd or even inputs depending upon whether Dout is an odd or even word.

Because of the sharing of a single read line 104 across both memory banks, a defect in just the memory bank 1 portion or in in just memory bank 0 portion of a given column 135 destroys the usefulness of that even or odd column. Such a defective column is replaced in a sense-amplifier redundancy scheme by a subsequent column for the same odd or even class. To perform this replacement requires a second stage of multiplexers 130 in output stage 120.

There is one multiplexer 130 for each bit in the output word Dout. Thus, a first multiplexer 130 selects for Dout[1], a second multiplexer 130 selects for Dout[2], and so on. Because of the two stages of 2:1 multiplexing, each multiplexer 130 except for a last multiplexer 130 for Dout[32] can ultimately select from the bit decisions from two even and odd column pairs. A bit decision from the even and odd column pair for a given word bit may be said to be the unshifted bit decision for that output bit's multiplexer 130 as received at an S2 input. For example, a bit decision from the first bit even and odd columns would be an unshifted bit decision for the multiplexer 130 for Dout[1]. In addition, each multiplexer 130 from the first multiplexer 130 through a next-to-last multiplexer 130 has an S1 input for receiving a bit decision from the subsequent bit's even and odd column pair. This bit decision may be denoted as the shifted bit decision. For example, the first multiplexer 130 can select for the bit decision from the second bit even and odd column pair at its S1 input. But there is no subsequent column for the thirty-second bit's even and odd column. The S1 input for this final bit's multiplexer 130 receives a redundant read line 145 from a redundant column 140. Redundant column 140 includes a redundant sense amplifier 105 for each memory bank.

For example, suppose an even column is defective but an odd word is being read from memory 100. In such a case, each multiplexer 130 is controlled to select for its unshifted input S2. But when an even word is sensed, multiplexers 130 are controlled to select for either their shifted or unshifted input depending upon their bit position with regard to the defective column. For example, suppose that the defect is in an ith even column, where i is an integer designating the bit position of the column. Multiplexers 130 prior to this bit position perform no shift. But multiplexers 130 corresponding to the ith bit position and onward are controlled to select for their shifted input. Redundant column 140 would then function as the last (thirty-second in this embodiment) even column. Such SA shifting through multiplexers 125 and 230 demands rather complicated control logic. In contrast, I/O shifting control logic is relatively simple.

There is thus a need in the art for a redundancy scheme that achieves the die savings of sense-amplifier shifting and the control logic simplicity of I/O shifting.

SUMMARY

An improved column redundancy scheme uses a single redundant column and a plurality of non-generic columns that couple to output latches through 2:1 multiplexers that are configured without dynamic shifting. In other words, the configuration of the 2:1 multiplexers is static and does not depend upon the word type such as even or odd being read from the memory. The columns are arranged in order from a first column to a last column followed by the redundant column. As used herein, a "column" is defined to correspond to a sense amplifier and its corresponding bit lines and associated memory cells. In addition, "column" is understood to include all the necessary structure to drive the column's read line. The columns are classified into different types corresponding to the different word types that are stored in the resulting memory. For example, a memory may store even and odd words that are sensed by even and odd sense amplifiers in corresponding even and odd columns. But a column type is a broader concept than just even and odd in that a memory may have any number of word types. The following discussion will thus use the terms "even column" and "odd column" without limitation to the exclusion of additional words types.

The lack of dynamic shifting means that the 2:1 multiplexers are static: their selection does not change depending upon the word type being read out of the memory regardless of whether the defective column is odd or even. This is quite advantageous in that there are no switching losses in the 2:1 multiplexers. In contrast, conventional sense amplifier shifting schemes would involve dynamic switching in such output multiplexers such that the multiplexers change their selection based upon the word type being read out and the identity (odd or even) of the defective column.

These and additional advantages may be better appreciated through the following detailed description.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Improved column redundancy schemes are provided for memories in which each column within a bank of memory cells has its own read line. The read line carries the bit decision from the column's sense amplifier. The memories may include one or more memory banks. The memory cells within each bank are arranged into rows and columns. Within the columns, there are a plurality of non-generic columns arranged in order from a first non-generic column to a last non-generic column. The last non-generic column is followed by a redundant column. For brevity, the expression "column" without any further clarification will be understood to refer to a non-generic column.

Each row of memory cells is arranged into at least two words such as even and odd words. In general, there may be more than two words per row. The number of words per rows determines the number of word types. Within the arrangement of columns, the columns are grouped in column bit groups according to the word bits. For example, suppose the word width is sixteen bits. The columns would thus be arranged a from a column bit group for the sixteenth bit through a column bit group for the first bit. Within each column bit groups are the columns for each word type for the corresponding bit. For example, if there are just even and odd words, each column bit group would have one even column and one odd column. More generally, there is a corresponding column in each column bit group for each word type.

A plurality of two-to-one multiplexers corresponds to the columns on a one-to-one basis. For brevity, the two-to-one multiplexers will also be denoted as just multiplexers herein. Since the columns are arranged from a first column to a last column, the multiplexers are also arranged from a first multiplexer to a last multiplexer given the one-to-one correspondence between the multiplexers and the columns. Each multiplexer from the first multiplexer through the next-to-last multiplexer is configured to select between the read line of the corresponding column and the read line of the subsequent column. The first multiplexer is thus configured to select between the read line from the first column and the read line of the second column, the second multiplexer is configured to select between the read line of the second column and the read line of the third column, and so on such that the next-to-last multiplexer is configured to select between the read line of the next-to-last column and the read line of the last column. Each multiplexer is thus configured to either select for an unshifted input (the read line of the corresponding column) or for a shifted input (the read line of the subsequent column). The last multiplexer is analogous in that it is configured to select between the read line of the last column (its unshifted input) and the read line of the redundant column (its shifted input).

A decoder controls each multiplexer responsive to whether one of the columns is defective. Should no column be defective, the decoder controls each multiplexer to select for its unshifted input. Conversely, suppose that the ith column is defective in an embodiment with a plurality of n columns, where i is an positive integer that is less than or equal to n, and where n is plural integer. The decoder would then control the multiplexers from the first multiplexer to the (i−1)th multiplexer to select for their unshifted inputs but control the multiplexers from the ith multiplexers on to select for their shifted inputs. But regardless of whether there are errors or not, the configuration of the multiplexers is static in that it does not change depending upon the word type being read out of the memory. The resulting memory redundancy scheme is thus quite advantageous in that the control logic is simplified and switching losses are minimized. These advantages may be better appreciated with consideration of the following example embodiments.

Figure 2:
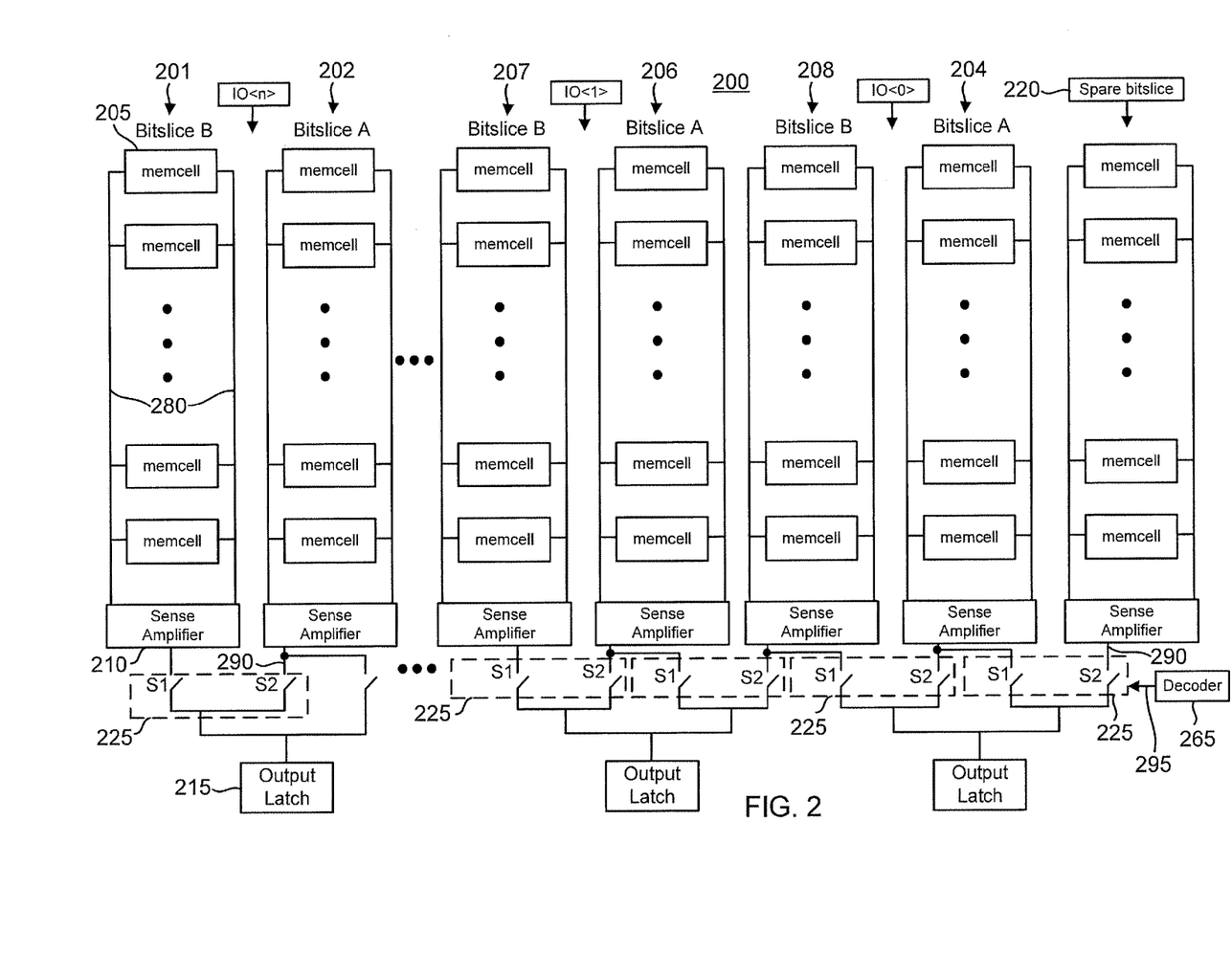
FIG. 2 is a diagram of a memory having just even and odd words configured with an improved column redundancy scheme in accordance with an aspect of the disclosure.

A memory 200 shown in FIG. 2 includes a plurality of (n+1) columns ranging from an initial column 201 through a last column 204. A redundant column 220 (which may also be denoted as a spare bitslice) follows last column 204. Each column includes a plurality of memory cells 205 arranged into rows. Redundant column 220 has a matching number of rows of memory cells 205. Memory cells 205 may comprise static random access memory (SRAM) cells in an SRAM embodiment for memory 200. Alternatively, memory cells 205 may comprise dynamic random access memory (DRAM) cells in a DRAM embodiment for memory 200. Memory cells 205 may also comprise FLASH memory cells or fuse memory cells in a read-only embodiment for memory 200.

In memory 200, memory cells 205 are SRAM cells such that each memory cell couples to two bit lines 280. Memory 200 is configured to store two types of words (even and odd) per row of memory cells 205. The odd words may be referred to as B words whereas the even words may be denoted as A words. Given such a designation, the columns alternate between B columns and A columns. The B columns may also be designated as B bitslices whereas the A columns may be alternatively designated as A bitslices. Each word is (n+1) bits wide. Given this word width, the A and B columns are arranged according to the bit position in their respective words. There is thus a pair (a column bit group) of A and B columns IO<n> for the (n+1)th bit. The column pairs are arranged in bit order such that the column pairs end in a column pair IO<1> for the second-to-last bit and a column pair IO<0> for the zeroth bit.

Each column includes a sense amplifier 210 for providing a bit decision when a word line (not illustrated) is asserted such that the corresponding memory cell 205 drives its bit value onto the corresponding bit lines 280. Each sense amplifier 210 drives its bit decision from a read operation onto a corresponding read line 290. To effect the column redundancy, memory 200 includes a plurality of 2:1 multiplexers 225 corresponding to the plurality of columns. There is thus one corresponding multiplexer 225 for each column. Each multiplexer 225 includes a switch S1 and a switch S2. Switch S1 may be denoted as the unshifted switch since it selects for the read line 290 of the corresponding column. But switch S2 may be denoted as the shifted switch since it selects for the read line 290 of the immediately-subsequent column to the corresponding column for the multiplexer 225.

Note again that the columns are arranged in order from a first column 201 to a last column 204. Each column but for last column 204 will thus have an immediately-subsequent column. For example, a second column 202 is the immediately-subsequent column to first column 201. The immediately-subsequent column to last column 204 is redundant column 220. Thus, the S2 switch in multiplexer 225 for last column 204 selects for the read line 290 from redundant column 220. A decoder 265 controls the configuration of multiplexers 225 with regard to the selection by the S1 and S2 switches through a control signal 295. Each S1 and S2 switch may comprise a transistor switch such as an NMOS transistor or PMOS transistor switch. Should no column be defective, decoder 265 closes each S1 switch and opens each S2 switch. Each multiplexer 225 selects for its unshifted column in such a non-defective configuration. Regardless of whether a shift is made or not, the bit decision from each column pair is stored is a corresponding latch 215. For example, a latch 215 stores the bit decision from column pair IO<n>, another latch 215 stores the bit decision from column pair <1>, and so on.

But suppose that a column 206 is defective. In that case, a column 207 immediately preceding defective column 206 is the final column that is non-defective in the column order from first column 201. Decoder 265 thus closes the S1 switch and opens the S2 switch in the multiplexers 225 corresponding to first column 201 through final non-defective column 207. Conversely, decoder 265 opens the S1 switch and closes the S2 switch in the multiplexers 225 corresponding to defective column 206 through final column 204. These multiplexers 225 thus select for their shifted column. The functional identity of defective column 206 through final column 205 is effectively shifted to the right by one column. For example, redundant column 220 assumes the function of last column 204. Similarly, last column 204 assumes the function of a second-to-last column 208, and so on.

Figure 3A:
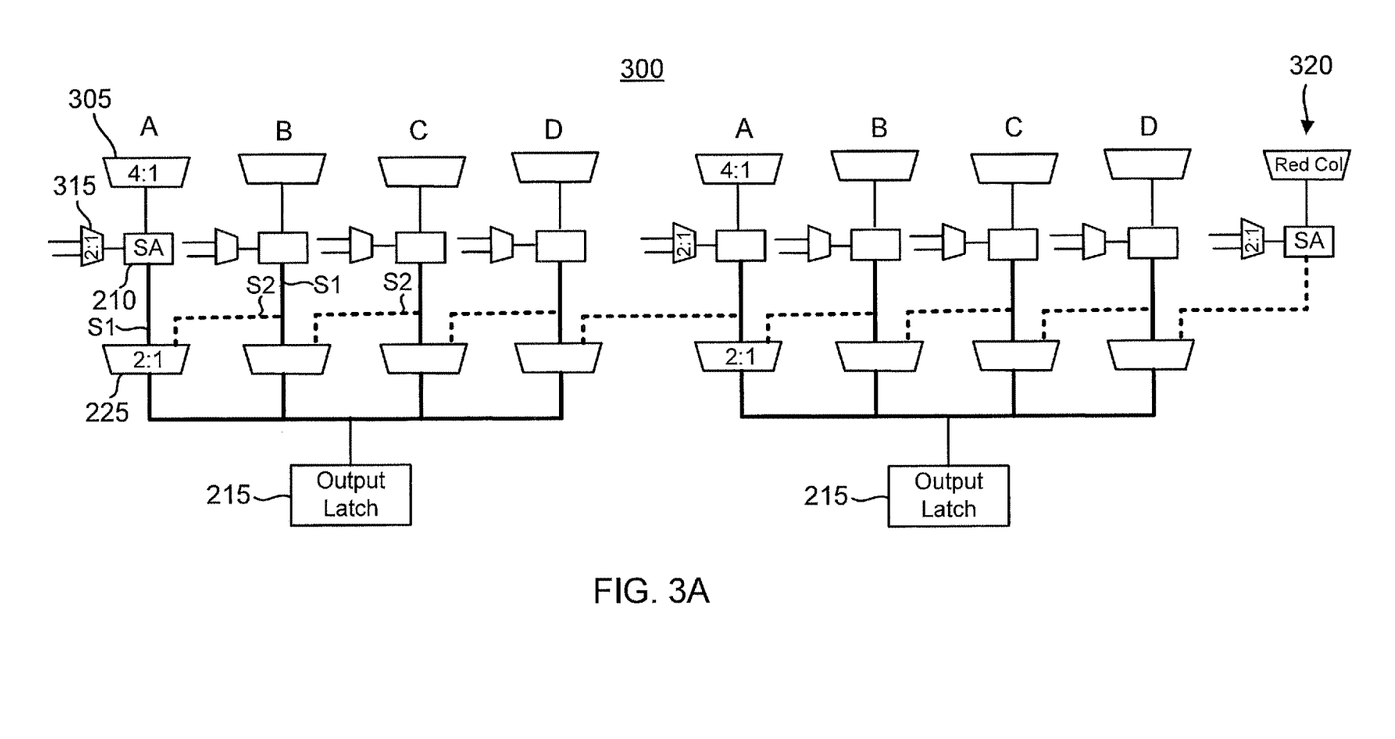
FIG. 3A is a diagram of a memory having four different word types configured with an improved column redundancy scheme in accordance with an aspect of the disclosure.

Regardless of what type of word is being read from memory 200, the configuration of multiplexers 225 is static. This is quite advantageous as the switching power losses within multiplexers 225 is thus minimized. Memory 200 thus enjoys the density advantages of a traditional sense-amplifier-shifting redundancy scheme without the traditional disadvantages of control complexity or dynamic switching power losses. In one embodiment, multiplexers 225 and decoder 265 may be deemed to form a means for selecting from the read lines 290 to output words from the memory 200, wherein, responsive to the defective column 206, the means is configured to select for the read lines 290 from all the columns except for the defective column 206 and to select for the read line from the redundant column to output a word from the memory FIG. 3A illustrates a portion of a memory 300 in which there are four column types A, B, C, and D corresponding to four different words stored for each row of memory cells (not illustrated). Each column includes 4 pairs of bit lines such that each sense amplifier 210 senses a selected bit line pair through a 4:1 multiplexer 305. Each sense amplifier 210 associates with a 2:1 multiplexer 315 that selects for the sense enable signal for the corresponding sense amplifier 210. The 2:1 multiplexer 225 for each column A through D has an unshifted input S1 that selects for the bit decision from the corresponding column's sense amplifier 210. Similarly, the 2:1 multiplexer 225 for each column A though D has a shifted input S2 that selects for the bit decision form the immediately-subsequent column's sense amplifier 210. In FIG. 3A, the shifted inputs S2 are designated by dotted lines since there are no errors such that no multiplexer 225 selects for its shifted input S2. A redundant column 320 is thus inactive as well.

Figure 3B:
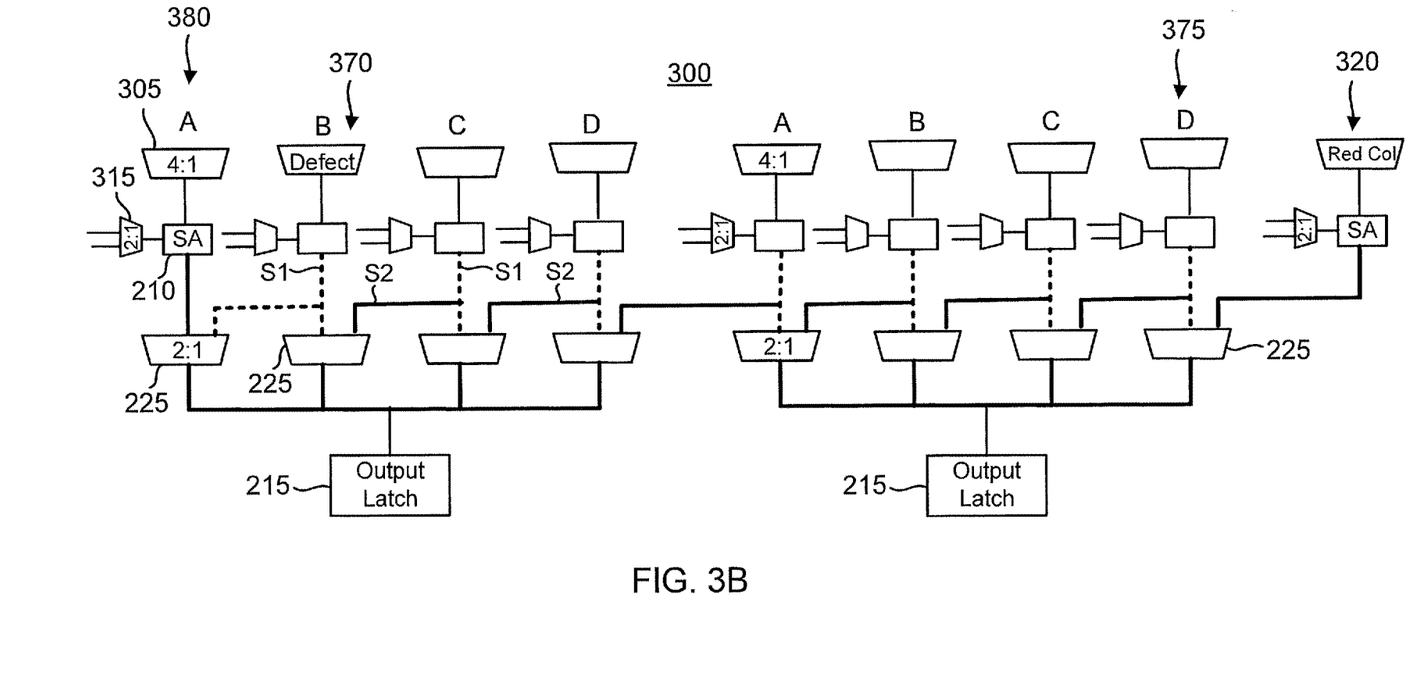
FIG. 3B illustrates the memory of FIG. 3A including a defective column.

In contrast, memory 300 is shown in FIG. 3B having a defective column 370. Multiplexers 225 from defective column 370 through a last column 375 thus select for their shifted inputs. The unshifted inputs for these multiplexers 225 are thus shown as dotted lines to indicate their inactive status. Redundant column 320 is thus active and performs the function of final column 375.

Figure 4:
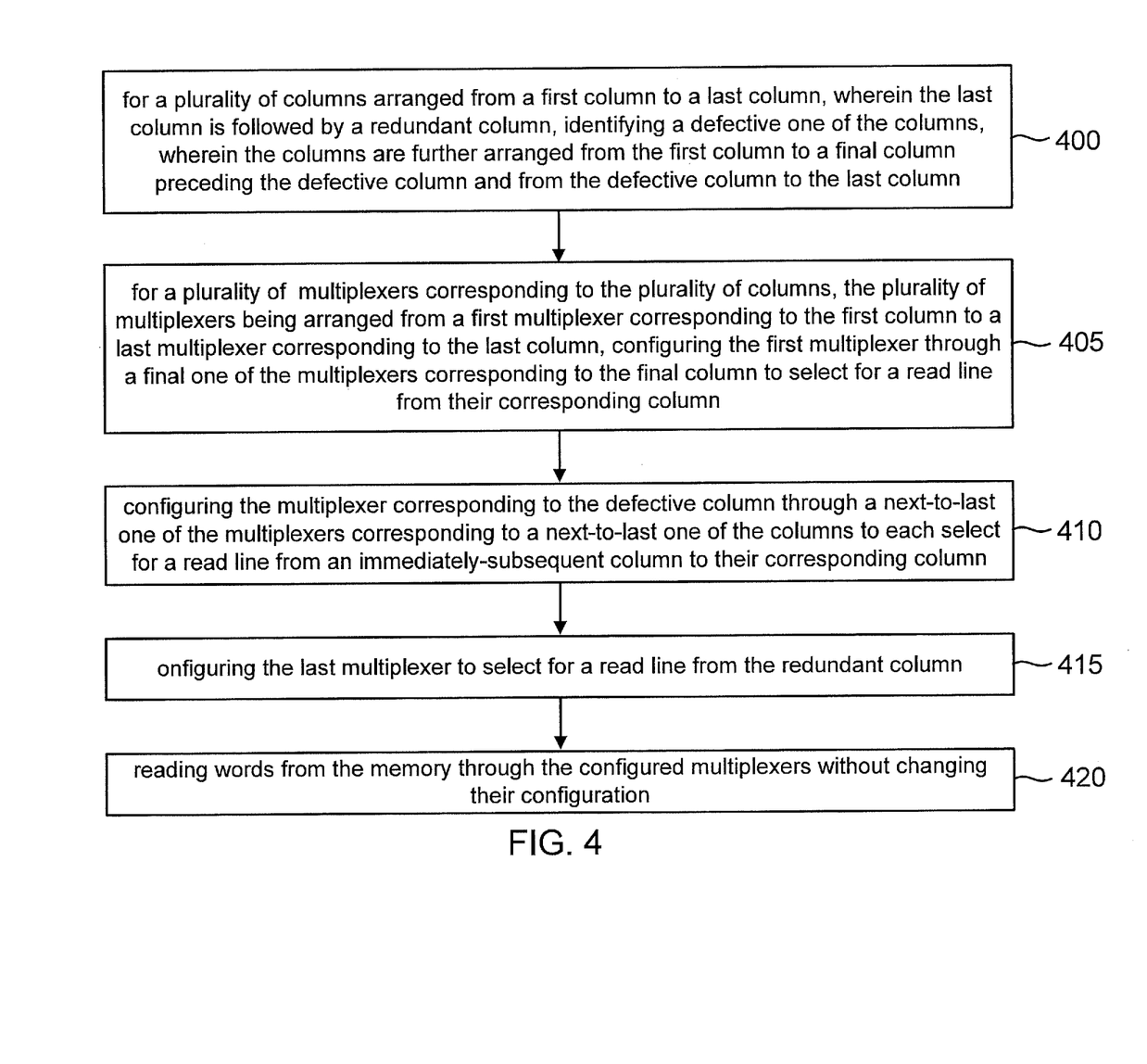
FIG. 4 is a flowchart for a method of sense amplifier shifting in accordance with an aspect of the disclosure.

A method of operation for memory redundancy will now be discussed with regard to the flowchart of FIG. 4. The method includes an act 400, for a plurality of columns arranged from a first column to a last column, wherein the last column is followed by a redundant column, of identifying a defective one of the columns; wherein the columns are further arranged from the first column to a final column preceding the defective column and from the defective column to the last column. Referring again to FIG. 2, column 206 was an example of the defective column whereas column 207 is an example of the final column preceding the defective column. Column 205 is an example of the first column and column 204 an example of the last column. Finally, redundant column 220 is an example of the redundant column.

The method further includes an act 405, for a plurality of multiplexers corresponding to the plurality of columns on a one-to-one basis, the plurality of multiplexers being arranged from a first multiplexer corresponding to the first column to a last multiplexer corresponding to the last column, of configuring the first multiplexer through a final multiplexer corresponding to the final column to select for a read line from their corresponding column. Referring again to FIG. 2, multiplexers 225 are arranged from a first multiplexer 225 for first column 201 to a last multiplexer 225 for last column 204. Similarly, a multiplexer 225 corresponds to final non-defective column 207. A configuration by decoder 265 through a command 290 for each multiplexer 225 from first column 205 through final non-defective column 207 to close its S1 switch and open its S2 switch is an example of act 405. Since no errors occur until defective column 206, first column 205 through final non-defective column 207 are not shifted.

The method also includes an act 410 of configuring a multiplexer corresponding to the defective column through a next-to-last multiplexer corresponding to a next-to-last column to select for a read line from an immediately-subsequent column to their corresponding column. Multiplexer 225 for next-to-last column 208 is an example of the next-to-last multiplexer. Decoder 265 commanding multiplexer 225 for defective column 206 through the next-to-last multiplexer 225 for next-to-last column 208 to open their S1 switch and close their S2 switch through command 290 is an example of act 410.

In addition, the method includes an act 415 of configuring the last multiplexer to select for a read line from the redundant column. The configuration of multiplexer 225 for last column 204 by decoder 265 to open its S1 switch and to close its S2 switch through command 290 is an example of act 415.

Finally, the method includes an act 420 of reading words from the memory through the configured multiplexers without changing their configuration. The reading of even and odd words through the configured multiplexers 225 is an example of act 420. The reading of these words does not require any reconfiguration of multiplexers 225 as discussed previously, which advantageously minimizes switching power losses within multiplexers 225.

Referring again to FIG. 2, note that regardless of the selection by multiplexers 225, each multiplexer 225 couples to two different read lines 290. To prevent contention between the corresponding sense amplifiers 210, each sense amplifier 210 may be configured to tri-state its output to the corresponding read line 290 when not sense enabled. There would thus be a sense enable signal for reading an even word from the A columns and a sense enable signal for reading an odd word from the B columns. When one column (or word) type of sense enable signal is asserted, the sense amplifiers for the remaining column (or word) type is tri-stated. Alternatively, additional multiplexing may be implemented as known in the art. In addition, note that each read line 290 may be shared by another bank of memory cells such as discussed with regard to FIG. 1. The disclosed memory redundancy scheme is thus generic to whether the memory contains a plurality of banks and is generic to the number of words stored per row of memory cells.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A memory, comprising:
a plurality of columns arranged into a plurality of column bit groups ranging from a first column bit group to a last column bit group, each column bit group including at least a column for an even word and a column for an odd word, the plurality of columns being further arranged from a first column in the first column bit group to a last column in the last column bit group, wherein each column includes a sense amplifier and a read line, and wherein the sense amplifier is configured to drive the read line with a bit decision for the column;
a redundant column following the last column, wherein the redundant column includes a redundant sense amplifier and a redundant read line, and wherein the redundant sense amplifier is configured to drive the redundant read line with a bit decision for the redundant column;
a plurality of multiplexers corresponding to the plurality of columns, wherein the multiplexers are arranged from a first multiplexer corresponding to the first column through a last multiplexer corresponding to the last column, wherein the first multiplexer through a next-to-last multiplexer in the plurality of multiplexers is each configured to select between the read line from the multiplexer's corresponding column and a read line from an immediately-subsequent column to the multiplexer's corresponding column, and wherein the last multiplexer is configured to select between the read line from the last column and the redundant read line;
a decoder configured to, responsive to a defect in a defective one of the columns, control the first multiplexer through a final multiplexer before the defective one of the columns to each select for the read line from their corresponding column and to control a multiplexer for the defective column through the next-to-last multiplexer to each select for the read line from the immediately-subsequent columns to their corresponding column, and to control the last multiplexer to select for the read line from the redundant column; and a plurality of latches corresponding to the plurality of column bit groups, wherein each latch is configured to store an output from each multiplexer for each column in the corresponding column bit group.

2. The memory of claim 1, wherein the decoder is further configured to control each multiplexer, responsive to an absence of a defect in each column, to each select for the read line from their corresponding column.

3. The memory of claim 1, wherein the columns configured to alternate between even columns for storing even words and odd columns for storing odd words, and wherein the decoder is further configured to maintain static the configuration of the multiplexers while even and odd ones of the words are read from the memory.

4. The memory of claim 1, wherein each multiplexer is a 2:1 multiplexer.

5. The memory of claim 1, wherein each multiplexer includes an unshifted switch that is closed when the multiplexer is configured to select for the read line of the corresponding column.

6. The memory of claim 5, wherein each multiplexer from the first multiplexer through the next-to-last multiplexer includes a shifted switch that is closed when the multiplexer is configured to select for the read line of the immediately-subsequent column to the corresponding column.

7. The memory of claim 1, wherein each column comprises a plurality of static random access memory (SRAM) cells.

8. A method for a memory comprising:
for a plurality of columns arranged into a plurality of column bit groups ranging from a first column bit group to a last column bit group, each column bit group including at least a column for an even word and a column for an odd word, the plurality of columns being further arranged from a first column in the first column bit group to a last column in the last column bit group, wherein each column includes a sense amplifier and a read line, and wherein the sense amplifier is configured to drive the read line with a bit decision for the column, and wherein the last column is followed by a redundant column, identifying a defective one of the columns, wherein the columns are further arranged from the first column to a final column preceding the defective column and from the defective column to the last column;
for a plurality of multiplexers corresponding to the plurality of columns, the plurality of multiplexers being arranged from a first multiplexer corresponding to the first column to a last multiplexer corresponding to the last column, configuring the first multiplexer through a final one of the multiplexers corresponding to the final column to select for a read line from their corresponding column;
configuring the multiplexer corresponding to the defective column through a next-to-last one of the multiplexers corresponding to a next-to-last one of the columns to each select for a read line from an immediately-subsequent column to their corresponding column;
configuring the last multiplexer to select for a read line from the redundant column; and
reading words from the memory through the configured multiplexers without changing their configuration by latching a bit decision from each column bit group in a corresponding latch.

9. The method of claim 8 further comprising tri-stating an output from the sense amplifier for each of the odd columns while reading even words from the memory.

10. The method of claim 9, further comprising tri-stating an output from the sense amplifier for each of the even columns while reading odd words from the memory.

11. The method of claim 8, wherein reading words through the configured multiplexers comprises retrieving the words from static random access memory (SRAM) cells within each column.

12. The method of claim 11, wherein retrieving the words from the SRAM cells within each column further comprises selecting from a plurality of bit lines in each column.

13. The method of claim 12, wherein the bit line selection in each column comprises a 4:1 bit line multiplexing selection.

14. A memory comprising:
a plurality columns, wherein the columns are arranged into a plurality of column bit groups ranging from a first column bit group to a last column bit group, each column bit group including at least a column for an even word and a column for an odd word, and wherein the columns are further arranged in a column order from a first column in the first column bit group to a last column in the last column bit group, and wherein one of the columns is a defective column;
a plurality of sense amplifiers corresponding to the plurality of columns;
a plurality of read lines corresponding to the plurality of columns, each sense amplifier being configured to drive a bit decision from its column onto its column's read line;
a redundant column following the last column, the redundant column including a redundant sense amplifier for driving a bit decision from the redundant column onto a redundant read line; and
means for selecting from the read lines from each column bit group to output words from the memory, wherein, responsive to the defective column, the means is configured to select for the read lines from all the columns except for the defective column and to select for the read line from the redundant column to output a word from the memory.

15. The memory of claim 14, wherein the plurality of columns include a plurality of static random access memory (SRAM) cells.

16. The memory of claim 14, wherein each column further includes a bit line multiplexer.

17. The memory of claim 16, wherein each bit line multiplexer is a 4:1 bit line multiplexer.

* * * * *